(12) United States Patent
Kelekar

(10) Patent No.: US 8,728,334 B2
(45) Date of Patent: May 20, 2014

(54) DYNAMIC GAS FLOW CONTROL OF TOUCHLESS REACTOR CELLS

(75) Inventor: Rajesh Kelekar, Los Altos, CA (US)

(73) Assignee: Intermolecular, Inc., San Jose, CA (US)

(*) Notice: Subject to any disclaimer, the term of this patent is extended or adjusted under 35 U.S.C. 154(b) by 344 days.

(21) Appl. No.: 13/306,767

(22) Filed: Nov. 29, 2011

(65) Prior Publication Data

US 2013/0133746 A1    May 30, 2013

(51) Int. Cl.
*H01L 21/302* (2006.01)
*B08B 3/04* (2006.01)
*C23F 1/02* (2006.01)

(52) U.S. Cl.
USPC ............... 216/41; 216/45; 216/83; 216/84; 438/689; 438/745; 134/2; 134/21; 134/26; 134/27; 134/902; 134/84; 134/88; 134/117; 134/137; 156/345.15; 156/345.19; 118/720; 118/721; 506/33; 269/20

(58) Field of Classification Search
None
See application file for complete search history.

(56) References Cited

U.S. PATENT DOCUMENTS

| | | | |
|---|---|---|---|
| 4,477,287 A | 10/1984 | Kush et al. | |
| 4,953,389 A | 9/1990 | Schurch | |
| 6,142,017 A | 11/2000 | Glassey | |
| 6,601,888 B2 | 8/2003 | Mcilwraith et al. | |
| 6,669,808 B2* | 12/2003 | Adachi et al. | 156/345.11 |
| 6,764,386 B2 | 7/2004 | Uziel | |
| 7,098,045 B2* | 8/2006 | Noji et al. | 438/5 |
| 7,456,930 B2 | 11/2008 | Hazelton et al. | |
| 8,161,802 B2 | 4/2012 | Haberland | |
| 8,617,409 B2* | 12/2013 | Kelekar et al. | 216/41 |
| 2013/0160858 A1* | 6/2013 | Francis | 137/1 |

FOREIGN PATENT DOCUMENTS

WO    2008121561 A1    10/2008

\* cited by examiner

*Primary Examiner* — Anita Alanko

(57) ABSTRACT

A protective chuck is disposed on a substrate with a gas layer between the bottom surface of the protective chuck and the substrate surface. The gas layer protects a surface region against a fluid layer covering the substrate surface. In some embodiments, the pressure fluctuation at the gas layers is monitored, and through the dynamic feedback, the gas flow rate can be adjusted to achieve a desired operation regime. The dynamic control of operation regime setting can also be applied to high productivity combinatorial systems having an array of protective chucks.

20 Claims, 16 Drawing Sheets

Supplying a gas flow to a bottom surface of a chuck, wherein the gas establishes a gas layer between the bottom surface and a first surface region of a substrate
1100

Supplying a fluid on a second surface region of the substrate, wherein the second surface region is different from the first surface region, wherein the first surface region is protected from the fluid by the gas layer
1110

Monitoring a pressure fluctuation of the gas layer
1120

Adjusting the gas flow to minimize the pressure fluctuation
1130

FIG. 11

DYNAMIC GAS FLOW CONTROL OF TOUCHLESS REACTOR CELLS

This application is related to U.S. application Ser. No. 13/081,914 filed on Apr. 7, 2011 and entitled "No-Contact Wet Processing Tool with Site Isolation", to U.S. application Ser. No. 13/192,677 filed on Jul. 28, 2011 entitled "No-Contact Wet Processing Tool with Fluid Barrier", to U.S. application Ser. No. 13/194,439 filed on Jul. 29, 2011 entitled "No-Contact Wet Processing Tool with Liquid Barrier", to U.S. application Ser. No. 13/272,041 filed on Oct. 12, 2011 entitled "Gas Barrier with Vent Ring for Protecting a Surface Region from Liquid", to U.S. application Ser. No. 13/272,041 filed on Oct. 12, 2011 entitled "Gas Barrier with Vent Ring for Protecting a Surface Region from Liquid", and to U.S. application Ser. No.13/337,374 filed on Dec. 27, 2011 entitled "Touchless Site Isolation Using Air Bearing" and having Attorney Docket number IM0438_US, the disclosures of which are incorporated by reference herein.

FIELD OF THE INVENTION

The present invention relates generally to combinatorial methods for device process development.

BACKGROUND OF THE INVENTION

The manufacture of advanced semiconductor devices entails the integration and sequencing of many unit processing steps, with potential new material and process developments. The precise sequencing and integration of the unit processing steps enables the formation of functional devices meeting desired performance metrics such as power efficiency, signal propagation, and reliability.

As part of the discovery, optimization and qualification of each unit process, it is desirable to be able to i) test different materials, ii) test different processing conditions within each unit process module, iii) test different sequencing and integration of processing modules within an integrated processing tool, iv) test different sequencing of processing tools in executing different process sequence integration flows, and combinations thereof in the manufacture of devices such as integrated circuits. In particular, there is a need to be able to test i) more than one material, ii) more than one processing condition, iii) more than one sequence of processing conditions, iv) more than one process sequence integration flow, and combinations thereof, collectively known as "combinatorial process sequence integration", on a single monolithic substrate without the need of consuming the equivalent number of monolithic substrates per material(s), processing condition(s), sequence(s) of processing conditions, sequence(s) of processes, and combinations thereof. This can greatly improve both the speed and reduce the costs associated with the discovery, implementation, optimization, and qualification of material(s), process(es), and process integration sequence(s) required for manufacturing.

Systems and methods for High Productivity Combinatorial (HPC) processing are described in U.S. Pat. No. 7,544,574 filed on Feb. 10, 2006, U.S. Pat. No. 7,824,935 filed on Jul. 2, 2008, U.S. Pat. No. 7,871,928 filed on May 4, 2009, U.S. Pat. No. 7,902,063 filed on Feb. 10, 2006, and U.S. Pat. No. 7,947,531 filed on Aug. 28, 2009 which are all herein incorporated by reference. Systems and methods for HPC processing are further described in U.S. patent application Ser. No. 11/352,077 filed on Feb. 10, 2006, claiming priority from Oct. 15, 2005, U.S. patent application Ser. No. 11/419,174 filed on May 18, 2006, claiming priority from Oct. 15, 2005, U.S. patent application Ser. No. 11/674,132 filed on Feb. 12, 2007, claiming priority from Oct. 15, 2005, and U.S. patent application Ser. No. 11/674,137 filed on Feb. 12, 2007, claiming priority from Oct. 15, 2005 which are all herein incorporated by reference.

HPC processing techniques have been used in wet chemical processing such as etching and cleaning. HPC processing techniques have also been used in deposition processes such as physical vapor deposition (PVD), atomic layer deposition (ALD), and chemical vapor deposition (CVD).

In standard HPC systems, multiple site isolated regions on a substrate surface can be formed by sealing different regions of the surface, isolating the surface regions from each other. The surface sealing can generate particles, which requires subsequent substrate cleaning. Therefore there is a need for non-contact isolation of surface regions on a substrate surface.

SUMMARY OF THE DESCRIPTION

In some embodiments, the present invention discloses methods and systems to control the operation regime of gas layers on a substrate surface by monitoring the pressure fluctuation at the gas layers. Multiple pressure value measurements, for example, measured at a second or a few seconds apart, can provide the pressure fluctuation information. Relative or absolute pressure fluctuations can be used to indicate the operation regime of the protective chuck. Through the feedback, the gas flow rate can be adjusted to achieve a desired operation regime.

In some embodiments, the pressure fluctuation can be determined by amplitude or frequency variations. In some embodiments, the gas flow rate is increased or decreased until a substantial change in pressure fluctuation is observed, which indicates a boundary of the operation regimes.

In some embodiments, the present invention discloses a high productivity combinatorial system using a plurality of non-contact protective chucks for excluding a plurality of regions of the substrate. In some embodiments, the present invention discloses a planar array of protective chucks sharing a common gas inlet, with two or more protective chucks having pressure gauges. The pressure gauges are preferably installed in boundary protective chucks that exhibit the highest variation in pressure values. Thus by monitoring and setting the operation regimes of these boundary protective chucks, other protective chucks should also be set at the same operation regime.

BRIEF DESCRIPTION OF THE DRAWINGS

To facilitate understanding, identical reference numerals have been used, where possible, to designate identical elements that are common to the figures. The drawings are not to scale and the relative dimensions of various elements in the drawings are depicted schematically and not necessarily to scale.

The techniques of the present invention can readily be understood by considering the following detailed description in conjunction with the accompanying drawings, in which:

FIG. 11 illustrates an exemplary flowchart of dynamic control according to some embodiments of the present invention.

FIGS. 15A-15B illustrate exemplary high productivity combinatorial systems, which employs protective chucks according to some embodiments of the present invention.

DETAILED DESCRIPTION

A detailed description of one or more embodiments is provided below along with accompanying figures. The detailed description is provided in connection with such embodiments, but is not limited to any particular example. The scope is limited only by the claims and numerous alternatives, modifications, and equivalents are encompassed. Numerous specific details are set forth in the following description in order to provide a thorough understanding. These details are provided for the purpose of example and the described techniques may be practiced according to the claims without some or all of these specific details. For the purpose of clarity, technical material that is known in the technical fields related to the embodiments has not been described in detail to avoid unnecessarily obscuring the description.

The present invention relates to systems and methods for isolating a surface region of a substrate, without contacting the surface, during a wet processing of the remaining surface. The present non-contact isolation can reduce or eliminate particulates or debris, especially at the boundary of the protected region. In some embodiments, the present invention discloses methods and systems for use in high productivity combinatorial processes.

"Combinatorial Processing" generally refers to techniques of differentially processing multiple regions of one or more substrates. Combinatorial processing generally varies materials, unit processes or process sequences across multiple regions on a substrate. The varied materials, unit processes, or process sequences can be evaluated (e.g., characterized) to determine whether further evaluation of certain process sequences is warranted or whether a particular solution is suitable for production or high volume manufacturing.

Figure 1:
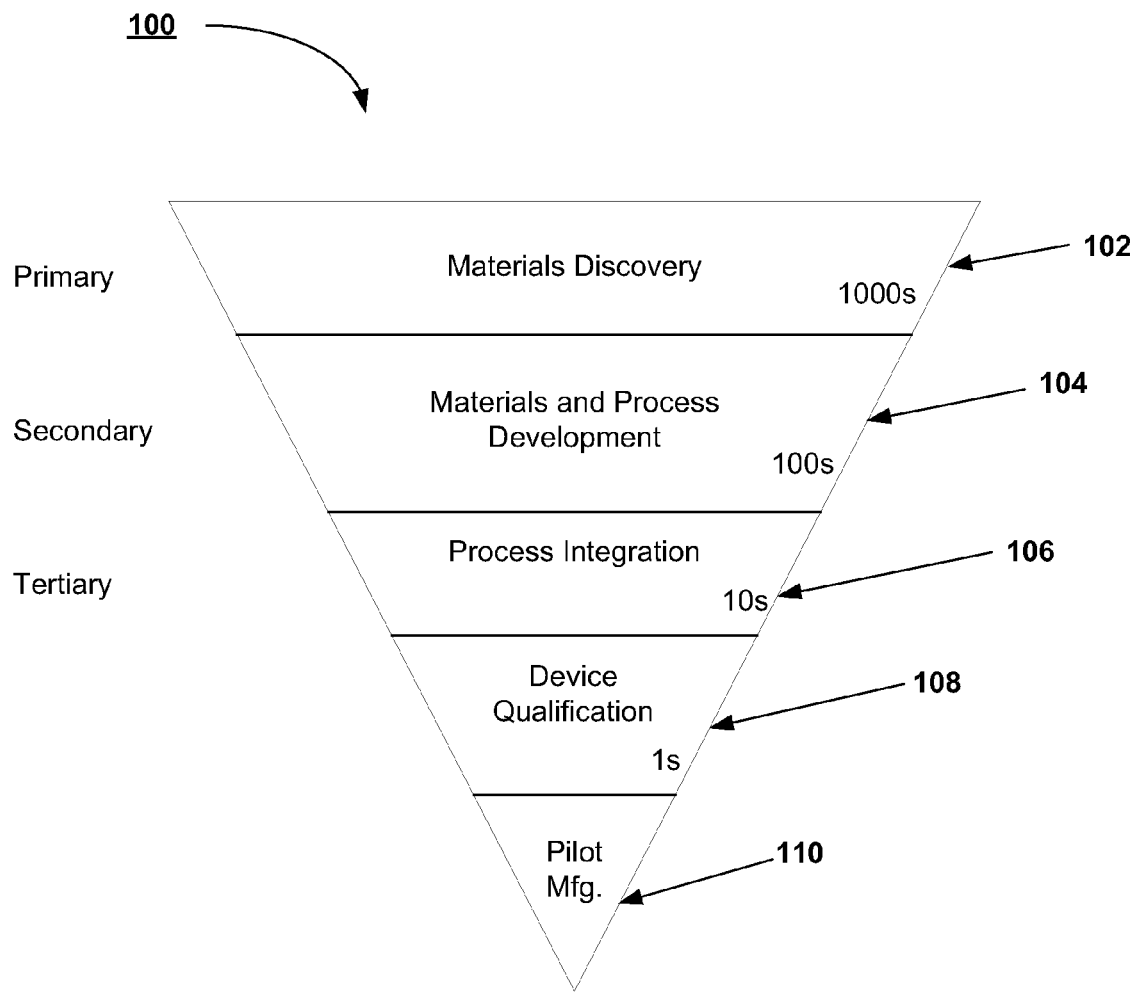
FIG. 1 illustrates a schematic diagram for implementing combinatorial processing and evaluation using primary, secondary, and tertiary screening.

FIG. 1 illustrates a schematic diagram, 100, for implementing combinatorial processing and evaluation using primary, secondary, and tertiary screening. The schematic diagram, 100, illustrates that the relative number of combinatorial processes run with a group of substrates decreases as certain materials and/or processes are selected. Generally, combinatorial processing includes performing a large number of processes during a primary screen, selecting promising candidates from those processes, performing the selected processing during a secondary screen, selecting promising candidates from the secondary screen for a tertiary screen, and so on. In addition, feedback from later stages to earlier stages can be used to refine the success criteria and provide better screening results.

For example, thousands of materials are evaluated during a materials discovery stage, 102. Materials discovery stage, 102, is also known as a primary screening stage performed using primary screening techniques. Primary screening techniques may include dividing substrates into coupons and depositing materials using varied processes. The materials are then evaluated, and promising candidates are advanced to the secondary screen, or materials and process development stage, 104. Evaluation of the materials is performed using metrology tools such as electronic testers and imaging tools (i.e., microscopes).

The materials and process development stage, 104, may evaluate hundreds of materials (i.e., a magnitude smaller than the primary stage) and may focus on the processes used to deposit or develop those materials. Promising materials and processes are again selected, and advanced to the tertiary screen or process integration stage, 106, where tens of materials and/or processes and combinations are evaluated. The tertiary screen or process integration stage, 106, may focus on integrating the selected processes and materials with other processes and materials.

The most promising materials and processes from the tertiary screen are advanced to device qualification, 108. In device qualification, the materials and processes selected are evaluated for high volume manufacturing, which normally is conducted on full substrates within production tools, but need not be conducted in such a manner. The results are evaluated to determine the efficacy of the selected materials and processes. If successful, the use of the screened materials and processes can proceed to pilot manufacturing, 110.

The schematic diagram, 100, is an example of various techniques that may be used to evaluate and select materials and processes for the development of new materials and processes. The descriptions of primary, secondary, etc. screening and the various stages, 102-110, are arbitrary and the stages may overlap, occur out of sequence, be described and be performed in many other ways.

This application benefits from High Productivity Combinatorial (HPC) techniques described in U.S. patent application Ser. No. 11/674,137 filed on Feb. 12, 2007 which is hereby incorporated for reference in its entirety. Portions of the '137 application have been reproduced below to enhance the understanding of the present invention. The embodiments described herein enable the application of combinatorial techniques to process sequence integration in order to arrive at a globally optimal sequence of device fabrication processes by considering interaction effects between the unit manufacturing operations, the process conditions used to effect such unit manufacturing operations, hardware details used during the processing, as well as materials characteristics of components utilized within the unit manufacturing operations. Rather than only considering a series of local optimums, i.e., where the best conditions and materials for each manufacturing unit operation is considered in isolation, the embodiments described below consider interactions effects introduced due to the multitude of processing operations that are performed and the order in which such multitude of processing operations are performed. A global optimum sequence order is therefore derived, and as part of this derivation, the unit processes, unit process parameters and materials used in the unit process operations of the optimum sequence order are also considered.

The embodiments described further analyze a portion or sub-set of the overall process sequence used to manufacture a semiconductor device. Once the subset of the process sequence is identified for analysis, combinatorial process sequence integration testing is performed to optimize the materials, unit processes, hardware details, and process sequence used to build that portion of the device or structure. During the processing of some embodiments described herein, structures are formed on the processed substrate which are equivalent to the structures formed during actual production of the device. For example, such structures may include, but would not be limited to, gate dielectric layers, gate electrode layers, spacers, or any other series of layers or unit processes that create an intermediate structure found on semiconductor devices. While the combinatorial processing varies certain materials, unit processes, hardware details, or process sequences, the composition or thickness of the layers or structures or the action of the unit process, such as cleaning, surface preparation, deposition, surface treatment, etc. is substantially uniform through each discrete region. Furthermore, while different materials or unit processes may be used for corresponding layers or steps in the formation of a structure in different regions of the substrate during the combinatorial processing, the application of each layer or use of a given unit process is substantially consistent or uniform throughout the different regions in which it is intentionally applied. Thus, the processing is uniform within a region (inter-region uniformity) and between regions (intra-region uniformity), as desired. It should be noted that the process can be varied between regions, for example, where a thickness of a layer is varied or a material may be varied between the regions, etc., as desired by the design of the experiment.

The result is a series of regions on the substrate that contain structures or unit process sequences that have been uniformly applied within that region and, as applicable, across different regions. This process uniformity allows comparison of the properties within and across the different regions such that the variations in test results are due to the varied parameter (e.g., materials, unit processes, unit process parameters, hardware details, or process sequences) and not the lack of process uniformity. In the embodiments described herein, the positions of the discrete regions on the substrate can be defined as needed, but are preferably systematized for ease of tooling and design of experimentation. In addition, the number, variants and location of structures within each region are designed to enable valid statistical analysis of the test results within each region and across regions to be performed.

Figure 2:
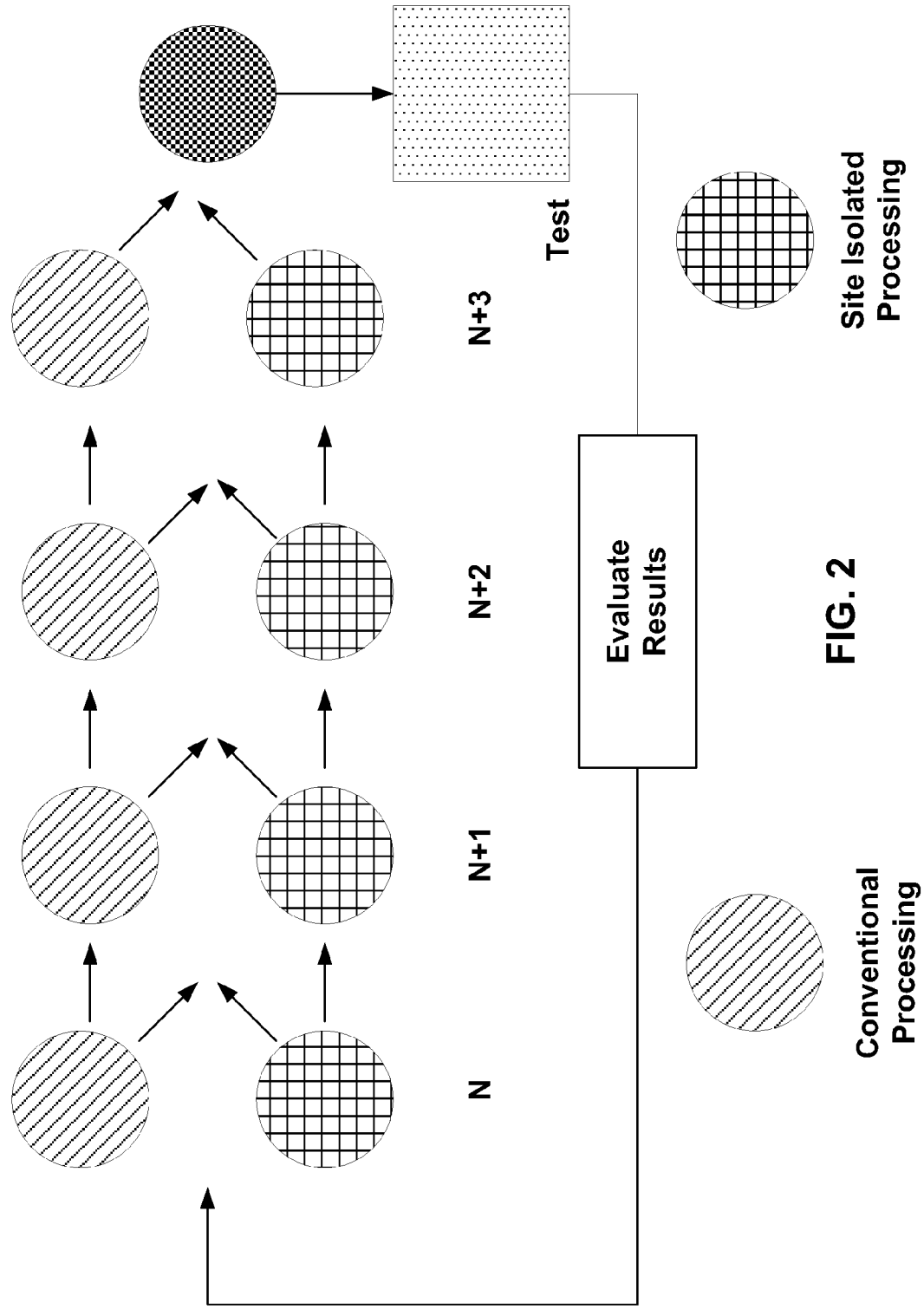
FIG. 2 is a simplified schematic diagram illustrating a general methodology for combinatorial process sequence integration that includes site isolated processing and/or conventional processing in accordance with one embodiment of the invention.

FIG. 2 is a simplified schematic diagram illustrating a general methodology for combinatorial process sequence integration that includes site isolated processing and/or conventional processing in accordance with one embodiment of the invention. In one embodiment, the substrate is initially processed using conventional process N. In one exemplary embodiment, the substrate is then processed using site isolated process N+1. During site isolated processing, an HPC module may be used, such as the HPC module described in U.S. patent application Ser. No. 11/352,077 filed on Feb. 10, 2006. The substrate can then be processed using site isolated process N+2, and thereafter processed using conventional process N+3. Testing is performed and the results are evaluated. The testing can include physical, chemical, acoustic, magnetic, electrical, optical, etc. tests. From this evaluation, a particular process from the various site isolated processes (e.g. from steps N+1 and N+2) may be selected and fixed so that additional combinatorial process sequence integration may be performed using site isolated processing for either process N or N+3. For example, a next process sequence can include processing the substrate using site isolated process N, conventional processing for processes N+1, N+2, and N+3, with testing performed thereafter.

It should be appreciated that various other combinations of conventional and combinatorial processes can be included in the processing sequence with regard to FIG. 2. That is, the combinatorial process sequence integration can be applied to any desired segments and/or portions of an overall process flow. Characterization, including physical, chemical, acoustic, magnetic, electrical, optical, etc. testing, can be performed after each process operation, and/or series of process operations within the process flow as desired. The feedback provided by the testing is used to select certain materials, processes, process conditions, and process sequences and eliminate others. Furthermore, the above flows can be applied to entire monolithic substrates, or portions of monolithic substrates such as coupons.

Under combinatorial processing operations the processing conditions at different regions can be controlled independently. Consequently, process material amounts, reactant species, processing temperatures, processing times, processing pressures, processing flow rates, processing powers, processing reagent compositions, the rates at which the reactions are quenched, deposition order of process materials, process sequence steps, hardware details, etc., can be varied from region to region on the substrate. Thus, for example, when exploring materials, a processing material delivered to a first and second region can be the same or different. If the processing material delivered to the first region is the same as the processing material delivered to the second region, this processing material can be offered to the first and second regions on the substrate at different concentrations. In addition, the material can be deposited under different processing parameters. Parameters which can be varied include, but are not limited to, process material amounts, reactant species, processing temperatures, processing times, processing pressures, processing flow rates, processing powers, processing reagent compositions, the rates at which the reactions are quenched, atmospheres in which the processes are conducted, an order in which materials are deposited, hardware details of the gas distribution assembly, etc. It should be appreciated that these process parameters are exemplary and not meant to be an exhaustive list as other process parameters commonly used in semiconductor manufacturing may be varied.

As mentioned above, within a region, the process conditions are substantially uniform, in contrast to gradient processing techniques which rely on the inherent non-uniformity of the material deposition. That is, the embodiments, described herein locally perform the processing in a conventional manner, e.g., substantially consistent and substantially uniform, while globally over the substrate, the materials, processes, and process sequences may vary. Thus, the testing will find optimums without interference from process variation differences between processes that are meant to be the same. It should be appreciated that a region may be adjacent to another region in one embodiment or the regions may be isolated and, therefore, non-overlapping. When the regions are adjacent, there may be a slight overlap wherein the materials or precise process interactions are not known, however, a portion of the regions, normally at least 50% or more of the area, is uniform and all testing occurs within that region. Further, the potential overlap is only allowed with material of processes that will not adversely affect the result of the tests. Both types of regions are referred to herein as regions or discrete regions.

Combinatorial processing can be used to produce and evaluate different materials, chemicals, processes, process and integration sequences, and techniques related to semiconductor fabrication. For example, combinatorial processing can be used to determine optimal processing parameters (e.g., power, time, reactant flow rates, temperature, etc.) of dry processing techniques such as dry etching (e.g., plasma etching, flux-based etching, reactive ion etching (RIE)) and dry deposition techniques (e.g., physical vapor deposition (PVD), chemical vapor deposition (CVD), atomic layer deposition (ALD), etc.). Combinatorial processing can be used to determine optimal processing parameters (e.g., time, concentration, temperature, stirring rate, etc.) of wet processing techniques such as wet etching, wet cleaning, rinsing, and wet deposition techniques (e.g., electroplating, electroless deposition, chemical bath deposition, etc.).

Figure 3:
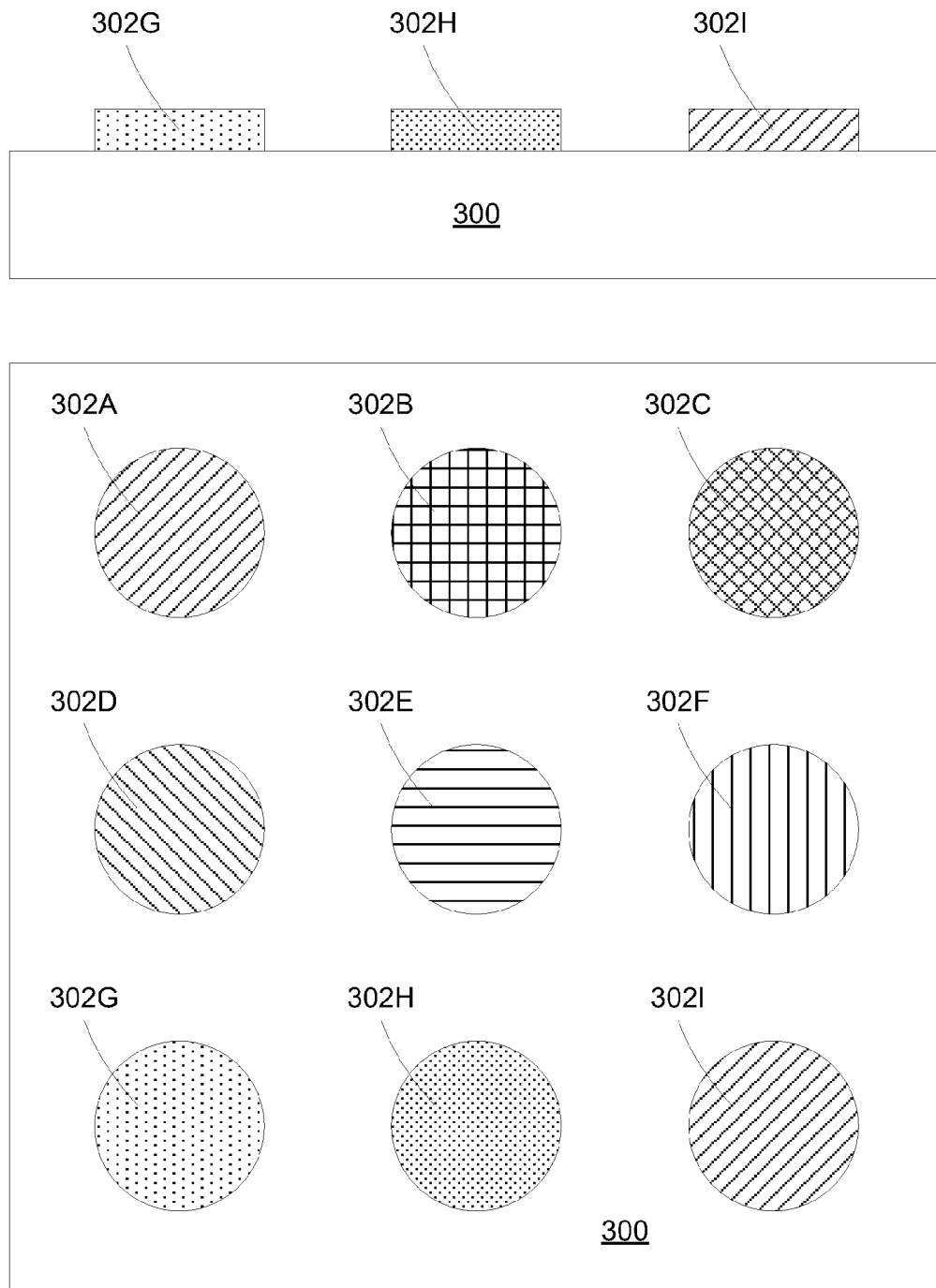
FIG. 3 illustrates a schematic diagram of a substrate that has been processed in a combinatorial manner.

FIG. 3 illustrates a schematic diagram of a substrate that has been processed in a combinatorial manner. A substrate, 300, is shown with nine site isolated regions, 302A-302I, illustrated thereon. Although the substrate 300 is illustrated as being a generally square shape, those skilled in the art will understand that the substrate may be any useful shape such as round, rectangular, etc. The lower portion of FIG. 3 illustrates a top down view while the upper portion of FIG. 3 illustrates a cross-sectional view taken through the three site isolated regions, 302G-302I. The shading of the nine site isolated regions illustrates that the process parameters used to process these regions have been varied in a combinatorial manner. The substrate may then be processed through a next step that may be conventional or may also be a combinatorial step as discussed earlier with respect to FIG. 2.

Figure 4:
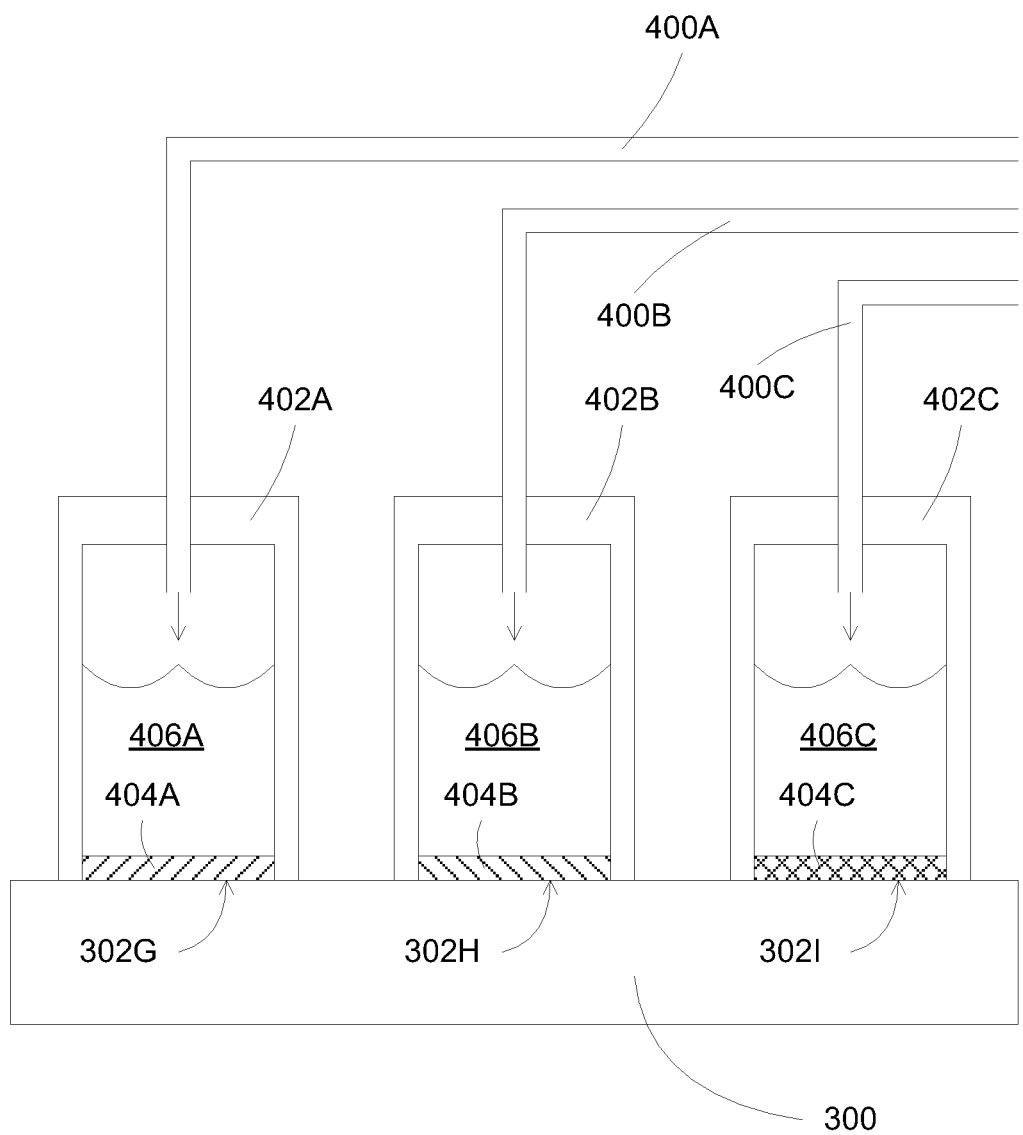
FIG. 4 illustrates a schematic diagram of a combinatorial wet processing system according to an embodiment described herein.

FIG. 4 illustrates a schematic diagram of a combinatorial wet processing system according to some embodiments described herein. A combinatorial wet system may be used to investigate materials deposited by solution-based techniques. An example of a combinatorial wet system is described in U.S. Pat. No. 7,544,574 cited earlier. Those skilled in the art will realize that this is only one possible configuration of a combinatorial wet system. FIG. 4 illustrates a cross-sectional view of substrate, 300, taken through the three site isolated regions, 302G-302I similar to the upper portion of FIG. 3. Solution dispensing nozzles, 400a-400c, supply different solution chemistries, 406A-406C, to chemical processing cells, 402A-402C. FIG. 4 illustrates the deposition of a layer, 404A-404C, on respective site isolated regions. Although FIG. 4 illustrates a deposition step, other solution-based processes such as cleaning, etching, surface treatment, surface functionalization, etc. may be investigated in a combinatorial manner. Advantageously, the solution-based treatment can be customized for each of the site isolated regions.

In some embodiments, the site isolated regions are the areas of interest in a combinatorial process, since they provide the variations of process and material parameters, which can be evaluated to obtain the optimum device structures and fabrication processes. In some embodiments, the surface areas outside the isolated regions are also processed, such as, to clean or etch the outside surface area. For example, to clean the outside surface areas with a wet cleaning fluid, the isolated regions are protected and cleaning chemical is introduced to the substrate surface.

In some embodiments, selective portions of the substrate surface can be processed, for example, surface processing at regions outside the regions protected by a chuck. For example, multiple site isolate regions on the substrate are protected from an outside fluid. The surface region on the substrate is formed without any physical contact with the substrate, preventing any generation of particulates or debris caused by contact friction.

In some embodiments, the substrate surface is covered with a fluid, for example, to clean or wet etch the substrate surface. The present non-contact protected surface regions can allow the exclusion of certain surface areas on the substrate from being similarly processed by the fluid without any potential damage caused by added particles.

In some embodiments, a protective chuck can be disposed on a surface region of a substrate with a gas layer in between. The gas layer comprises a gas with adequate pressure to levitate the protective chuck about the substrate surface, preventing the protective chuck from contacting the substrate, and to form a barrier region, blocking the outside fluid.

In some embodiments, the present invention relates to non-contact blockage of regions on a substrate surface using gas layers. A protective chuck having a gas layer at a bottom surface can block surrounding fluid from entering the region under the chuck bottom surface. The gas layer can be established by having a gas flowing across the bottom surface, through a gas inlet and an exhaust outlet. The pressure of the gas layer can be controlled by the gas flow rate and by the exhaust conductance.

Figure 5A:
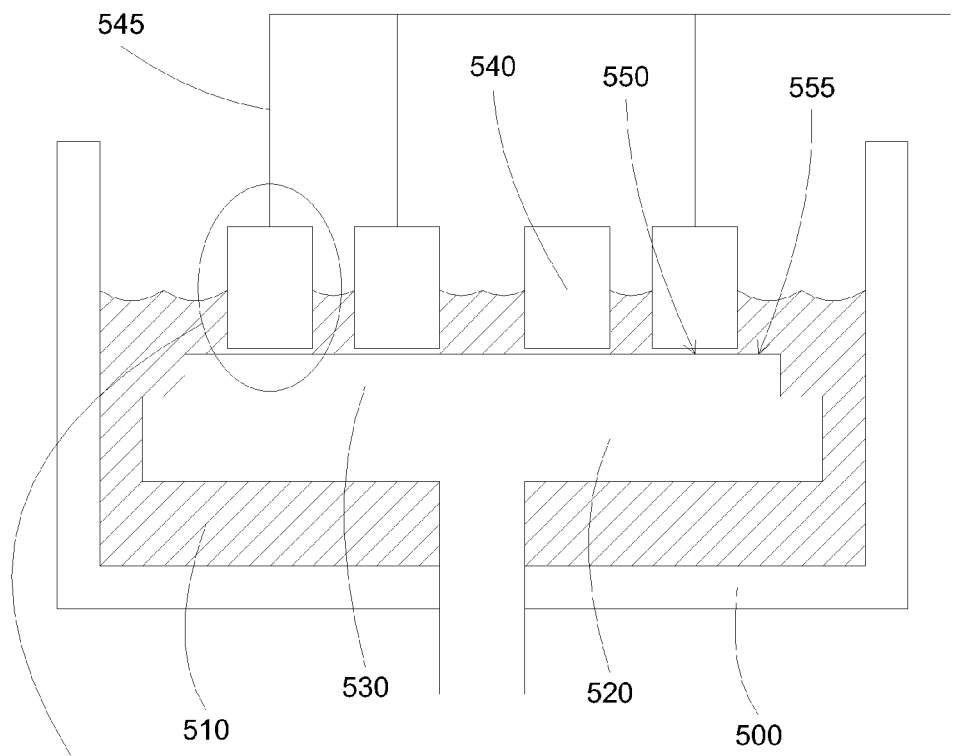
FIGS. 5A-5B illustrate an exemplary surface protection with air layer according to some embodiments of the present invention.
Figure 5B:
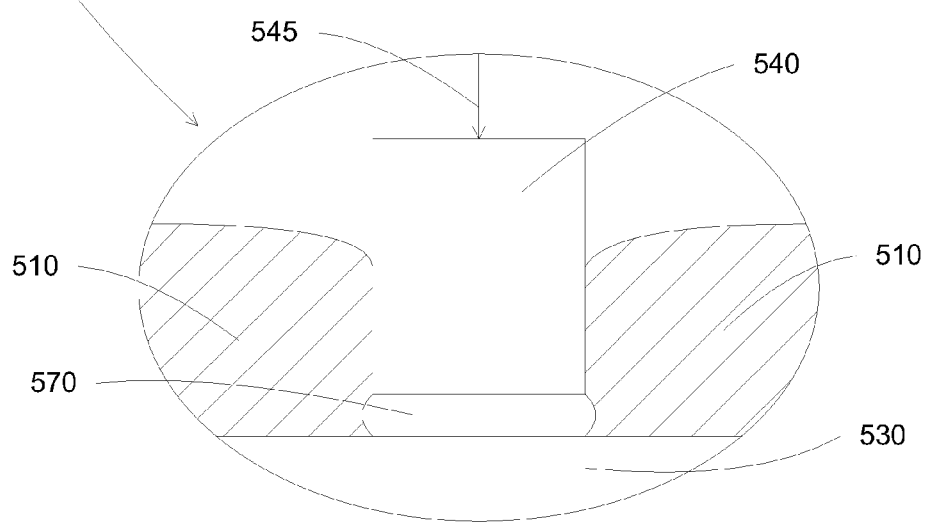

FIGS. 5A-5B illustrate an exemplary surface protection chuck with an air layer according to some embodiments of the present invention. In FIG. 5A, a process chamber 500 supports a pedestal 520 having a substrate 530 disposed thereon. The substrate 530 is submerged in a processing fluid 510, for example, a cleaning fluid, a rinsing fluid, or an etching fluid. The process chamber 500 can be a part of a HPC system, which comprises a plurality of protective chucks 540 protecting isolated regions 550 of the substrate. Gas lines 545 can be supplied to the protective chucks 540, for example, to pressurize the inside of the protective chucks 540 against the surrounding fluid 510. The surface area 555 of the substrate, outside the protected isolated regions 550, is processed by the processing fluid 510.

FIG. 5B shows an exemplary configuration of a protective chuck 540 protecting surface 550 regions of the substrate 530 against the fluid processing 510. A gas layer 570 is formed under the protective chuck 540, for example, with supplied gas coming from gas inlet 545. The gas layer 570 forms a pressurized layer, preventing the fluid 510 from entering the surface region 550. The fluid 510 thus stays within the surface region 555, outside the region 550. The gas layer 570 provides a non-contact protection of the region 550, eliminating any particle or debris generation due to abrasive contacts.

In some embodiments, the protective chuck comprises a substantially flat bottom surface, e.g., the surface to be disposed in proximity with the substrate surface. The protective chuck also comprises a second surface covering the remaining surface of the protective chuck, including the side surface and the top surface. The substantially flat bottom surface can form a substantially uniform gap with the substrate, enabling a gas flow across the flat bottom surface to create a gas layer through a higher pressure gas layer than the outside pressure.

Figure 6A:
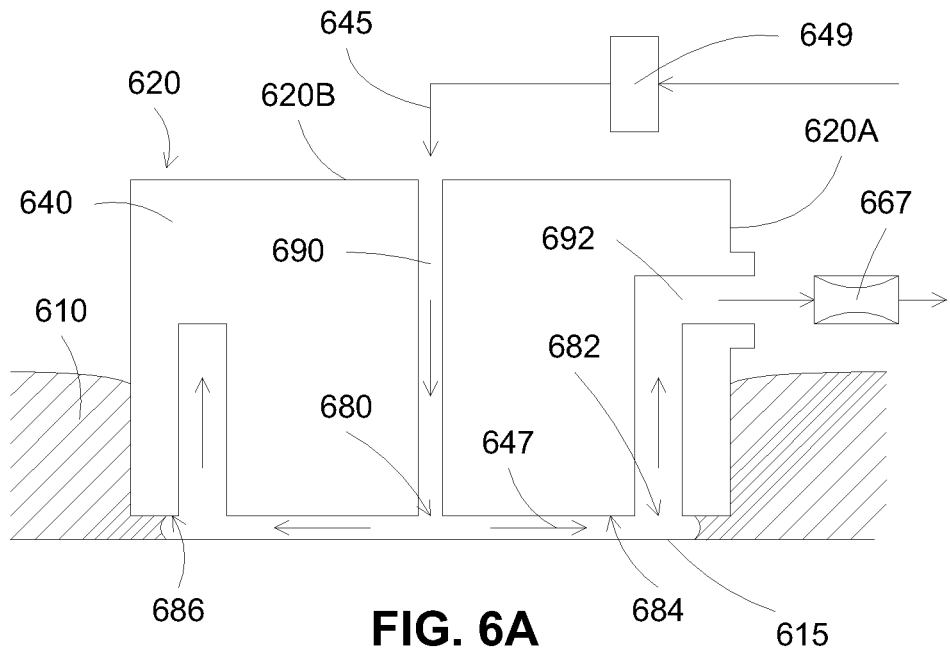
FIGS. 6A-6B illustrate an exemplary protective chuck according to some embodiments of the present invention.
Figure 6B:
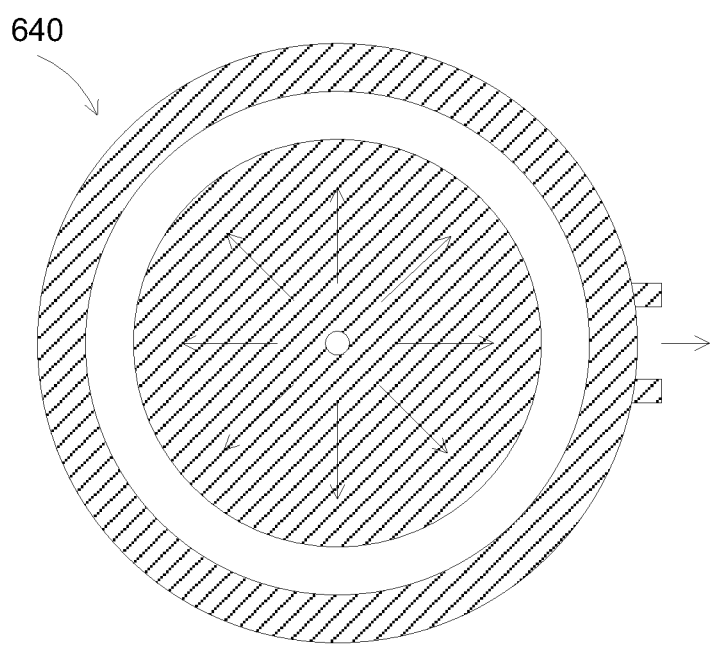

FIGS. 6A-6B illustrate an exemplary protective chuck according to some embodiments of the present invention. FIG. 6A shows a cross section side view and FIG. 6B shows a bottom view of the protective chuck 640. The protective chuck 640 comprises a substantially flat bottom surface 684 and 686, to be disposed in close proximity with the substrate surface 615. The protective chuck also comprises a second surface 620, covering the rest of the chuck surface, for example, comprising a top surface 620B and a side surface 620A. The second surface can be used for gas connection, such as inlet and outlet ports for gas supply to form the gas layer.

In some embodiments, the bottom flat surface comprises two substantially flat areas: an outer substantially flat area 686 surrounding a peripheral of the bottom surface and an inner substantially flat area 684 surrounding an inner opening 680, such as a recessed area. The inner opening 680 is preferably disposed at a center of the bottom surface, but can be located anywhere within the inner substantially flat area 684. The area 682 between the outer flat area 686 and the inner flat area 684 is also preferably recessed, forming an outer recessed ring 682 surrounding the inner flat area. A gas flow 647 between the opening 680 and the recessed area 682 along the inner flat area 684 can establish a gas layer, which can act as an air bearing to levitate the protective chuck 640 above the substrate surface 615.

The opening 680 and the recessed area 682 are coupled to first and second conduits 690 and 692, respectively, leading to the second surface 620, e.g., the outside surface of the protective chuck, to form an inlet and an outlet of the gas flow. For example, first conduit 690 connects the inner opening 680 with the top surface 620B of the chuck. Second conduit 692 connects the outer recessed area 682 with the side surface 620A of the chuck. Coupling can be provided at the end of the conduits at the outside surface for ease of connection to an external gas flow assembly. One conduit can serve as a gas inlet, and the other conduit served as a gas outlet. For example, the first conduit 690 can accept a gas input flow through a coupling to a gas source 645, preferably through a flow meter 649 to measure the gas flow, or a flow controller to control the gas flow. The second conduit 692 can be left open, forming a vent ring that releases the gas output flow to atmosphere. A restricting valve 667 can be coupled to the gas output flow, for example, externally to the protective chuck after the gas outlet, or internally within the second conduit, to regulate a flow resistance, or a flow conductance, of the gas flow, affecting the gas pressure at the gas layer. For example, with a same gas flow at the first conduit inlet, a more restricted second conduit would increase the gas pressure at the gas layer.

Other configurations can also be used, such as a recessed area comprising a plurality of outlets distributed in a periphery for optimizing the gas flow, an integrated flow restrictor and rough surface to enhance functionality and flexibility.

In some embodiments, the gas flow between the first and second conduits along the inner substantially flat area forms a gas layer that levitates the protective chuck and protects the surface region of the substrate from a fluid disposed on the substrate outside the surface region. In some embodiments, other means to levitate the protective chuck can be used, such as magnetic levitation or electric repulsion.

During processing, a liquid 610 is introduced to a region on the substrate surface, outside the region covered by the bottom surface of the chuck. The gas layer can prevent the liquid 610 from reaching the substrate surface region under the bottom surface of the chuck. The liquid can be a processing liquid, for example, an etch solution to etch a layer on the substrate. Since the substrate surface region under the chuck is protected by the gas bearing, the etching process only etches the substrate surface outside the chuck area. After finish processing, the liquid 610 is drained, e.g., removed from the substrate surface.

In some embodiments, the substrate can be processed using a protective chuck configured for forming a gas bearing at a bottom surface of the protective chuck. After supplying a gas flow to the protective chuck to create a gas flow along the bottom surface, the protective chuck is lowered onto a substrate. Under appropriate conditions, such as proper gas flow and air gap between the bottom surface of the protective chuck and the substrate surface, the gas flow can cause the protective chuck to be levitated above the substrate surface, forming a surface region on the substrate that is protected by the gas layer against a fluid disposed on the substrate surface outside the surface region.

In some embodiments, the gas flow to the protective chuck exits at a first location on the bottom surface. The first location can be disposed at a middle area of the bottom surface, and preferably configured to be distributed along a peripheral of a center area for uniform flowing across the bottom surface area. Upon approaching the substrate surface, the gas flow runs along the gap between the bottom surface of the protective chuck and the substrate surface. Upon encountering and being blocked by the outside fluid, the gas flow exits through a second location on the bottom surface. The second location can be disposed at a peripheral of the bottom surface, and preferably surrounding the bottom surface, leaving a small bottom surface ring around the outer edge of the protective chuck.

In some embodiments, the protective chuck protects the surface region from the fluid without contacting the surface region. The gas flow of the gas layer can be configured to balance the fluid flow, forcing the fluid to stay outside the surface region protected by the protective chuck. The boundary between the gas layer and the outside fluid can be at the outer edge of the protective chuck, or can be somewhat inside the edge, depending on the gas flow. At high flow, the gas can exert a strong force against the fluid, with some gas entering the fluid, forming bubbles at the area surrounding and outside the protective chuck. At low flow, the fluid pushes into the protected area, with some fluid mixing with the gas at the gas exhaust location, forming bubbles at the area surrounding and inside the protective chuck.

In some embodiments, the flow of the gas to the bottom surface of the protective chuck and/or the resistance or conductance of the gas flow path is controlled to achieve a desired gas layer, and effectively a desired boundary region between the fluid outside the surface region and the gas within the surface region. A desired gas flow can be used, establishing a gas layer that forms a fluid-gas boundary at the outer edge of the protective chuck, without any bubbles inside or outside of the protected area.

Figure 7A:
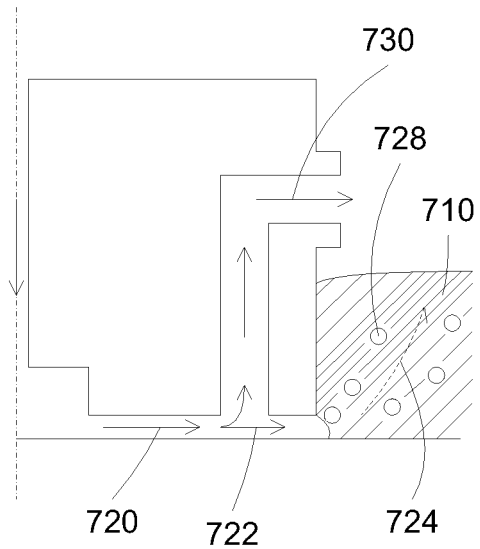
FIGS. 7A-7C illustrate different exemplary modes of operation for a gas layer according to some embodiments of the present invention.
Figure 7B:
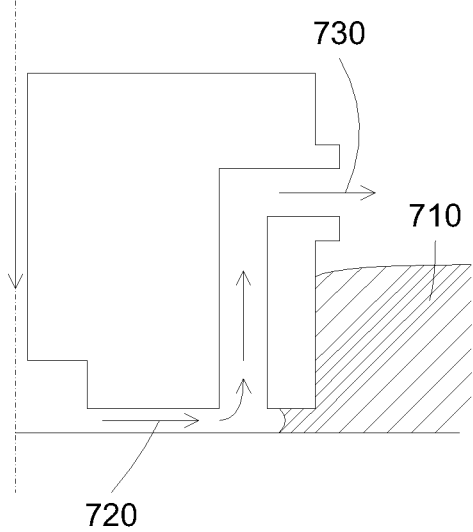
Figure 7C:
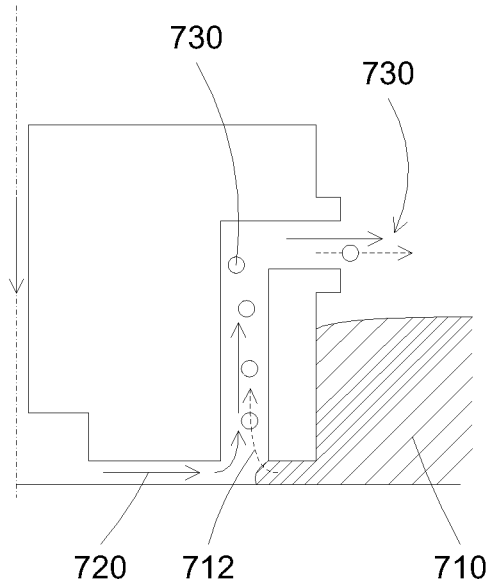

FIGS. 7A-7C illustrate different exemplary modes of operation for a gas layer according to some embodiments of the present invention. In general, if the gas pressure within the gas layer is too high, excess gas can escape to the surrounding fluid, creating bubbles toward the fluid surrounding the protective chuck. The high pressure can be established by a high gas flow, a low flow conductive exhaust, or a protective chuck configuration favoring high pressure gas layer. Conversely, if the gas pressure is too low, outside fluid can enter the gas stream, creating aerated gas flow having fluid bubbles.

FIG. 7A shows a schematic behavior of a bleeding mode, where the gas in the gas layer bleeds out to the surrounding liquid. A protective chuck has a high gas layer pressure, for example, created by high gas flow 720 across the inner flat bottom surface of the protective chuck 700. A portion 730 of the gas flow 720 follows the exhaust. A portion 722 of the flow 720 can escape through the fluid 710, generating a flow 724 of gas bubbles 728 at the area surrounding the protective chuck side surface.

FIG. 7B shows a schematic behavior of a static mode, where the gas flow forms a stable bubble under the protective chuck. A protective chuck has a balance gas layer pressure. Both the fluid and gas are blocked at the gas bearing interface, forming a protected region under the protective chuck without bubble formation. The gas-fluid boundary 770 can be varied across the outer flat area, offering a process window for the balanced gas layer pressure.

FIG. 7C shows a schematic behavior of a flow mode, where the liquid flows into the cell at the exhaust port. A protective chuck has a low gas layer pressure, for example, created by low gas flow 720 across the inner flat bottom surface of the protective chuck 700. With the low pressure, the fluid can enter the exhaust flow stream 730, generating a flow 712 of fluid bubbles 718 within the exhaust flow 730, creating an aerated flow 730.

Figure 8:
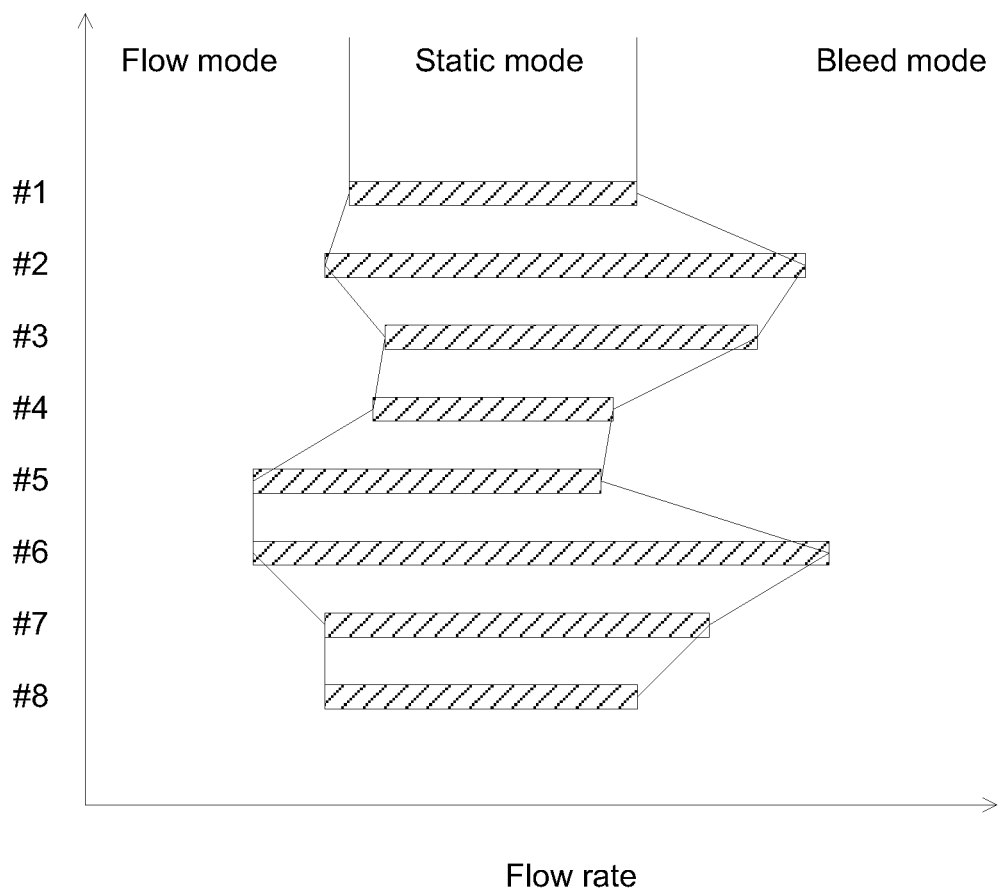
FIG. 8 illustrates operation modes for different system configurations according to some embodiments of the present invention.

FIG. 8 illustrates operation modes for different system configurations according to some embodiments of the present invention. Eight different liquids and protective chuck designs (labeled #1 to #8) are evaluated for assessing different modes of operation. All eight configurations exhibit similar general behavior, which shows a flow mode observed at low flow, a bleed mode observed at high flow, and in between, a static mode is observed. Though the general trend is similar, the boundaries of these operation modes are different for different configurations. However, it is observed that the process window is sufficiently wide for setting a flow rate that can meet a desired operation mode for a large number of system configurations.

In some embodiments, the present invention thus discloses a dynamic gas flow control to optimize the operation mode of the protective chuck. For example, static mode with a lowest flow rate can be preferred for processing, and the present invention discloses a dynamic method to achieve the preferred operation mode, especially for multiple protective chucks with manufacturing variations and for unknown process conditions.

The present invention discloses a correlation between the operation modes and the gas layer pressure, and thus can use pressure measurements of the gas layer to determine the operation mode, which then can be adjusted by varying the gas flow.

In some embodiments, the present invention discloses monitoring the pressure of the gas layer to control the non-contact protection of regions on the substrate surface. The three modes of operations based on the gas flows to the protective chuck are also directly related to the pressure of the gas layer. For example, at high pressures, the gas layer can expand, and a portion of the gas within the gas layer can escape to the surrounding fluid, generating gas bubbles at areas surrounding the protective chuck. At low pressures, the gas layer can retract, and a portion of the surrounding fluid can enter the protective chuck, to exit through the gas exhaust outlet. At appropriate pressures, e.g., between the high pressures and the low pressures, the gas layer is stable, without any fluid entering the gas exhaust outlet and without any gas escaping to the surrounding fluid. In some embodiments, the gas pressure of the gas layer is measured, and used to regulate the gas flow to dynamically achieve a desired gas pressure.

In some embodiments, the present invention discloses configuring a protective chuck with a pressure gauge to monitor the pressure of the gas layer. The pressure gauge is preferably incorporated at a vent portion of the gas flow, for example, at an exit of the gas flow after flowing across the bottom surface. The pressure gauge is also preferably disposed at a distance from the exhaust outlet, to avoid any influence of the exhaust ambient. The pressure gauge can provide pressure data at the gas layer, enabling dynamic controls of the gas layer, regardless of the variations in the surrounding fluid.

In some embodiments, a pressure gauge is provided to measure the gas pressure of the gas layer. The pressure gauge can be coupled to the bottom surface, such as at the inner or outer recessed areas. In some embodiments, a dead area can be provided for pressure measurement, avoiding measuring directly at a gas flow path.

Figures 9A, 9B:
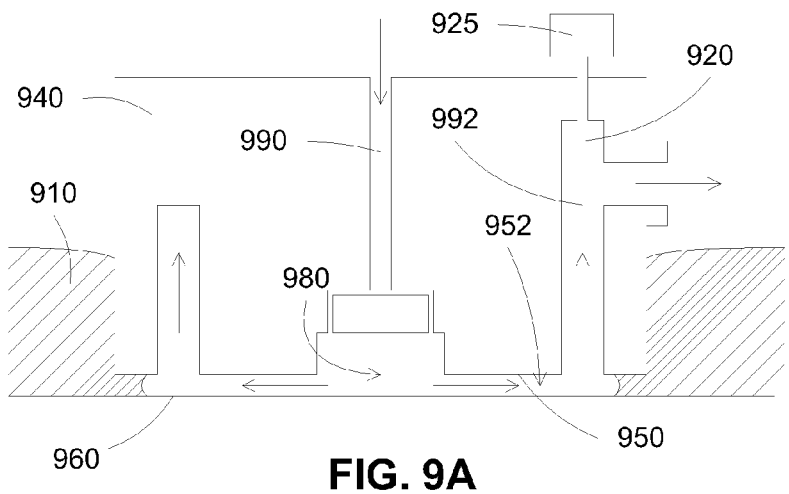
FIG. 9A illustrates an exemplary protective chuck configured for coupling with a pressure gauge according to some embodiments of the present invention.
FIG. 9B illustrates an exemplary relationship between the gas flow and the pressure of the gas layer according to some embodiments of the present invention.

FIG. 9A illustrates an exemplary protective chuck configured for coupling with a pressure gauge according to some embodiments of the present invention. A protective chuck 940 comprises a recessed area 980, which form a pocket of gas pressure to equalize the flow along the bottom surface 950 of the protective chuck, between the gap 952 formed by the chuck surface 950 and the substrate surface 906. The recessed area 980 is coupled to the first conduit 990 to provide an input gas for the gas layer. The outlet of the first conduit 990 can comprise a plurality of outlets distributed in a peripheral of the recessed area. The peripheral distribution of the plurality of outlets is preferably uniform, allowing an even distribution of gas flow along the bottom surface of the protective chuck. Second conduit 992 provides an exhaust for the input gas after passing through the gas 952. The gas layer at the gap 952 protects the substrate surface under the chuck from being processed by the liquid 910, disposed on the substrate outside the chuck. A recess 920 is formed at the exhaust port 992 to provide a stable volume for measuring the pressure of the gas layer. Other locations within the gas flow can also be used. A pressure gauge 925 can be coupled to the recess 920 to measure the gas pressure at the exhaust flow 992, which represents the pressure of the gas layer.

The pressure of the gas layer, measured by the pressure gauge, is typically proportional to the inlet gas flow rate, with higher flow rates resulting in higher gas pressures.

FIG. 9B illustrates an exemplary relationship between the gas flow rate and the pressure of the gas layer according to some embodiments of the present invention. The average pressure measurements, shown as circles on the graph, indicate a linear correlation with the gas flow rate settings. It is recognized that the pressure variations with respect to the gas flow rates span across the operating modes of the gas layer, without adequate indications of the operating modes. For example, pressure values can be shown to be a linear function of inlet flow rates, running from the low pressure regime to the stable regime to the high pressure regime without adequate sensitivity to distinguish the three separate regimes.

Also shown on the graph are the fluctuations of the pressure values, denoted as lines across the circles. Higher fluctuations can be seen at flow mode and bleed mode, with more stable pressure observed at static mode. Also shown in the graph is time dependence of the pressure for different gas flows. In the regime of low gas flow 932, a high fluctuation of pressure is seen as a function of time. In the regime of medium gas flow 934, a low fluctuation of pressure is seen as a function of time. In the regime of high gas flow 936, a high fluctuation of pressure is seen again as a function of time.

In some embodiments, the present invention recognizes that the pressure fluctuation can offer information relating to the different operating regimes. For example, at stable pressure regime, the gas flow is stable without losing gases to the surrounding fluid and without gaining fluid to the gas exhaust. The stable flow rate leads to stable pressure measurements, e.g., the pressure values do not change significantly with time.

In contrast, at high or low pressure regimes, the gas exhaust flow is dynamic, affected by the outward gas bubbling to the surrounding fluid or by the inward fluid bubbling to the gas exhaust. The dynamic gas exhaust flow leads to a high pressure fluctuation at the gas layer, resulting in higher pressure fluctuation in high and low pressure regimes as compared to the stable regime.

In some embodiments, the present invention discloses methods and systems to control the operation regime of gas layers on a substrate surface by monitoring the pressure fluctuation at the gas layers. Multiple pressure value measurements, for example, measured at a second or a few seconds apart, can provide the pressure fluctuation information. Relative or absolute pressure fluctuations can be used to indicate the operation regime of the protective chuck. Through the feedback, the gas flow rate can be adjusted to achieve a desired operation regime. For example, to achieve a stable operation regime, the gas flow rate is dynamically adjusted to minimize the pressure fluctuation, which is an indication of the stable regime.

Figure 10:
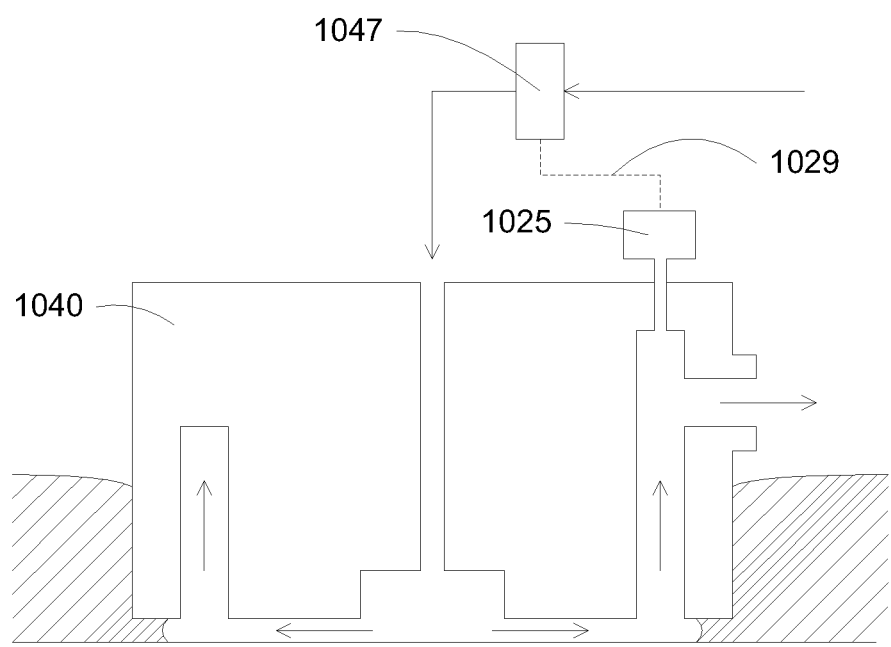
FIG. 10 illustrates an exemplary dynamic controlling of a protective chuck according to some embodiments of the present invention.

FIG. 10 illustrates an exemplary dynamic control of a protective chuck according to some embodiments of the present invention. A protective chuck 1040 comprises a pressure gauge 1025, which is coupled to a flow controller 1047, for example, by an electrical signal path 1029. The gas flow to the protective chuck can be dynamically adjusted based on a pressure reading of the pressure gauge 1025. An optional controller can be included to control the flow controller 1047 based on the pressure reading.

In some embodiments, the pressure fluctuation can be determined by amplitude variations, e.g., the changes of the pressure values as a function of time, such as during a number of successive measurements. In some embodiments, the stable regime has pressure fluctuations of less than about 0.1 inch of water (about 40 bars). In some embodiments, minimize the pressure fluctuation comprises adjusting the gas flow rate to reduce the pressure fluctuation to be lower than about 0.1 inch of water.

In some embodiments, the pressure fluctuation can be determined by frequency variations, e.g., the rates of change of the pressure values as a function of time. A Fourier transform can be performed on the pressure-time curve to obtain a pressure-frequency curve, which shows the rates of change of the pressure. In some embodiments, the stable regime has pressure fluctuations of less than about 10 Hertz. In some embodiments, minimize the pressure fluctuation comprises adjusting the gas flow rate to reduce the pressure fluctuation to be lower than about 10 Hertz.

In some embodiments, the gas flow rate is increased or decreased until a substantial change in pressure fluctuation is observed, which indicates a boundary of the operation regimes. In some embodiments, a starting gas flow rate is set, and a pressure fluctuation is measured. The gas flow rate is increased, and the pressure fluctuation is monitored until a substantial pressure fluctuation change is observed. Alternatively, the flow rate is increased to minimize a leakage fluid flow to the gas exhaust. The leakage fluid flow to the gas exhaust can exhibit foaming at the exhaust, or bubbles at the surrounding fluid. The flow rate then decreases, and the pressure fluctuation is monitored until a second substantial pressure fluctuation change is observed. Alternatively, the flow rate is increased to minimize a leakage gas flow to the surrounding fluid. The leakage gas flow to the surrounding fluid can exhibit bubbles at the surrounding fluid. The flow rate values at the two substantial pressure fluctuation changes indicate the boundaries of the different operation regimes. Other variations can be used, such as decreasing the flow rate before increasing In some embodiments, the starting gas flow is set at a middle range of the gas flow capability. For example, if the gas flow can be set between about 0 and about 14 l/min, the flow rate can be started at about 7 l/min. The starting gas flow rate can be determined based on experience or other data indicating a possible stable regime.

FIG. 11 illustrates an exemplary flowchart of dynamic control according to some embodiments of the present invention. Operation 1100 supplies a gas flow to a bottom surface of a chuck, wherein the gas establishes a gas layer between the bottom surface and a first surface region of a substrate. The chuck is preferably disposed above the substrate without touching the substrate. In some embodiments, the gas layer further functions to levitate the chuck above the substrate surface. In some embodiments, magnetic levitation can be applied. A vent exhaust can be added to the bottom surface of the chuck, providing a return path for the gas flow.

Operation 1110 supplies a fluid on a second surface region of the substrate, wherein the second surface region is different from the first surface region, wherein the first surface region is protected from the fluid by the gas layer. The fluid can be a processing fluid, such as a cleaning fluid or an etching fluid, to process the substrate surface region outside the region protected by the chuck.

Operation 1120 monitors a pressure fluctuation of the gas layer. In some embodiments, a pressure gauge is disposed on the vent exhaust of the chuck, allowing the measurements of the pressure of the gas layer. Multiple measurements can be performed, allowing a determination of the changes in pressure. In some embodiments, the pressure changes can be measured as a function of time, with the fluctuation determined from the changes in pressure amplitudes at measurements at different times. In some embodiments, the pressure fluctuation can be determined from the frequency or period of the changes in pressure measurements. For example, a rapid change (or a short time) in pressure values can indicate a high pressure fluctuation.

Operation 1130 adjusts the gas flow to minimize the pressure fluctuation. The static mode of operation is characterized by a lower pressure fluctuation that the other operation modes of flow mode and bleed mode, and thus a static mode can be dynamically achieved by adjusting the gas flow until the pressure fluctuation is minimized. In some embodiments, a low gas flow is preferred to reduce expenses. The gas flow can be adjusted by increasing or decrease the gas flow until observing a substantial change in pressure fluctuation. Alternatively, the gas flow can be increased or decreased to minimize a fluid flow from the remaining surface to the surface region.

In some embodiments, the gas flow is started at a middle range of the gas flow capability. Afterward, a pressure fluctuation is measured, and the gas flow is decreased until a substantial change in pressure fluctuation is observed. If the pressure fluctuation increases, it could indicate that the gas flow enters the flow mode from the static mode, and the gas flow is then slowly increased to return to the static mode with a minimum gas flow. If the pressure fluctuation decreases, it could indicate that the gas flow enters the static mode from the bleed mode, and the gas flow is then continued to decrease to return to reach the boundary of the static mode and the flow mode.

Alternatively, a gas flow can start at a low value/high value with a measurement of pressure fluctuation. The gas flow can then increase/decrease, respectively, until a change in pressure fluctuation is observed.

In some embodiments, the pressure fluctuation is determined by amplitude variations. For example, the pressure fluctuation can be minimized by reducing the amplitude variations of the gas pressure to less than about 0.1 inch of water. In some embodiments, the pressure fluctuation is determined by frequency variations. For example, the pressure fluctuation can be minimized by reducing frequency variations of the gas pressure to less than about 10 Hertz.

Figure 12A:
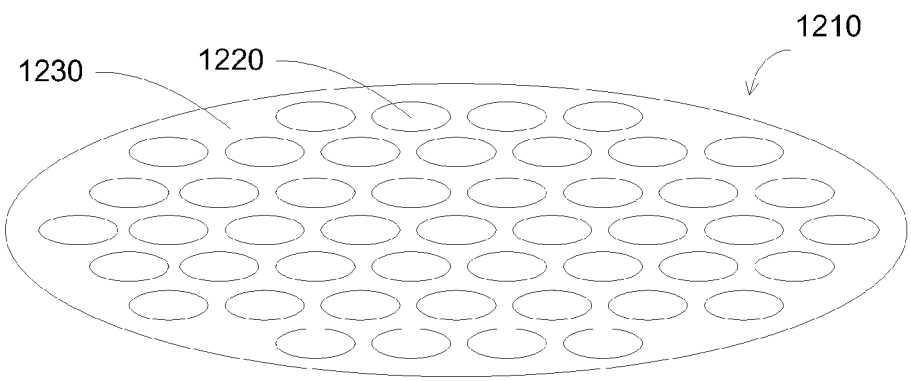
FIG. 12A illustrates a substrate having multiple site isolated regions.

In some embodiments, the present invention discloses a high productivity combinatorial system using a plurality of non-contact protective chucks for excluding a plurality of site isolated regions of the substrate. FIG. 12A illustrates a substrate 1210 having multiple site isolated regions 1220. The remaining substrate surface 1230, e.g., the substrate surface outside of the site isolated regions 1220, can be processed by shielding the site isolated regions, preferably by a plurality of touchless protective chucks that form gas layers with the substrate. The plurality of protective chucks can each comprise a flow controller to set the flow rate of the protective chuck and a pressure gauge to monitor a pressure of the gas layer. Alternatively, multiple protective chucks can share a flow controller, and pressure gauges can be incorporated only in selected protective chucks.

In some embodiments, the present invention discloses a method to calibrate an array of protective chucks, which can be used for forming site isolated regions on a substrate for combinatorial processing. Due to process variations, unknown liquid can be used, and the gas flow corresponding to the static mode might not be known. In addition, though manufacturing at a same specification, some chucks within the array might have fabrication variations, which can vary the mode of operation.

In some embodiments, the present invention discloses a method to identify the chucks that exhibit the most fluctuation in pressure in the chuck array. The pressure within the gas layer of these chucks will be monitored for determining the operation mode. The present method can reduce the complexity of the chuck array, limiting the pressure gauge installation to a few numbers of chucks, and also reducing the complexity of measurements, since only the predetermined chucks are monitored.

Figure 12B:
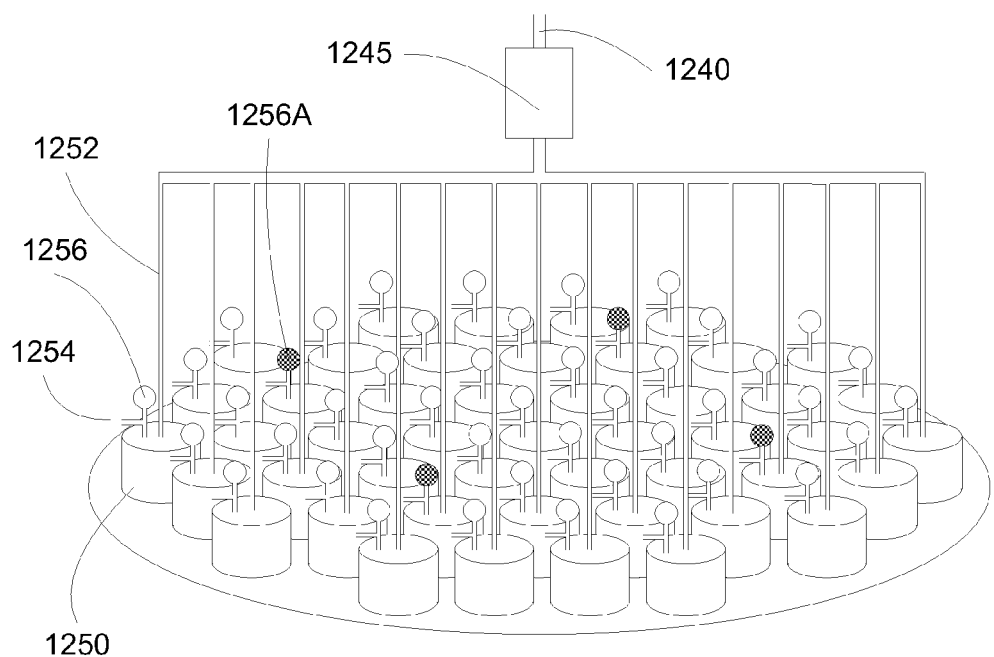
FIG. 12B illustrates an array of protective chucks disposed on a substrate according to some embodiments of the present invention.

FIG. 12B illustrates an array of protective chucks disposed on a substrate according to some embodiments of the present invention. Multiple protective chucks 1250 are touchlessly disposed on the substrate, protecting the multiple site isolated regions under the bottom surfaces of the chucks. A planar array of protective chucks can share a common gas inlet, with two or more protective chucks having pressure gauges. A common gas inlet 1240, controlled by a flow controller 1245, provides gas flows to each of the protective chucks through gas inlet 1252. Each protective chuck also has a vent exhaust for exhausting the gas flow. A pressure gauge 1256 is coupled to each of the vent exhaust line to measure pressure, and pressure fluctuation, of the gas layer under each protective chuck.

After identifying the protective chucks 1256A within a chuck array that exhibit the most and/or the least pressure fluctuation, the chuck array can be used in a combinatorial system with pressure gauges installed only at the identified chucks (herein called boundary protective chucks). For example, the pressure gauges are preferably installed in one, two, or more protective chucks that exhibit highest variation in pressure values. Thus by monitoring and setting the operation regimes of these boundary protective chucks, other protective chucks should also be set at the same operation regime. The protective chucks exhibiting highest pressure variations, for example, showing highest and lowest pressure values for the gas layers with a common gas flow rate, can be determined by a calibration procedure. For example, a calibration procedure can comprise measuring pressure values of the gas layers for all protective chucks, and the protective chucks having largest pressure differences are identified.

Figure 13:
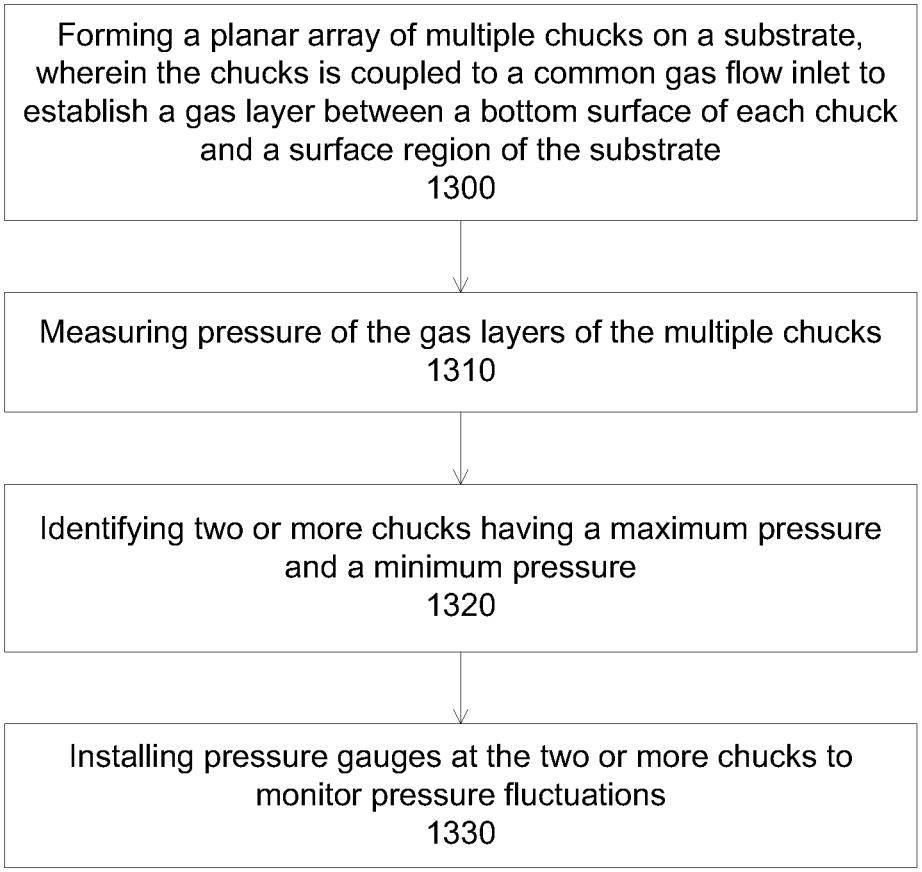
FIG. 13 illustrates an exemplary method for setting a chuck array for a combinatorial system according to some embodiments of the present invention.

FIG. 13 illustrates an exemplary method for setting a chuck array for a combinatorial system according to some embodiments of the present invention. Operation 1300 forms a planar array of multiple chucks on a substrate, wherein the chucks are coupled to a common gas flow inlet to establish a gas layer between a bottom surface of each chuck and a surface region of the substrate. In some embodiments, the chuck array comprises a number of chucks corresponding to a number of predetermined site isolated regions of the substrate. The chuck array can be configured to protect the site isolated regions during substrate processing, to ensure that only the substrate regions outside of the site isolated regions are processed. The chucks can form gas layers at the bottom surfaces to form touchless protection, blocking the site isolated regions without any physical contact.

Operation 1310 measures pressure of the gas layers of the multiple chucks. In some embodiments, each chuck has a pressure gauge installed for monitoring the pressure of the gas layer. The pressure gauges provide a mapping of pressure values, and/or pressure fluctuation, across the substrate.

Operation 1310 identifies two or more chucks having a maximum pressure and a minimum pressure. In some embodiments, one or more chucks can be identified as having the highest pressure fluctuation. Operation 1310 installs pressure gauges at the two or more chucks to monitor pressure fluctuations. The chucks that exhibit the extreme response, e.g., highest and lowest pressure values or highest or lowest pressure fluctuations are preferably monitored. Then by setting these chucks at the proper operation regime, for example, at static mode, other chucks should be within the same operation regime.

In some embodiments, the present invention discloses setting an operation regime for an array of protective chucks that share a common gas inlet, through monitoring pressure fluctuation at two or more representative protective chucks, which are identified for each configuration of the chuck array.

Figure 14:
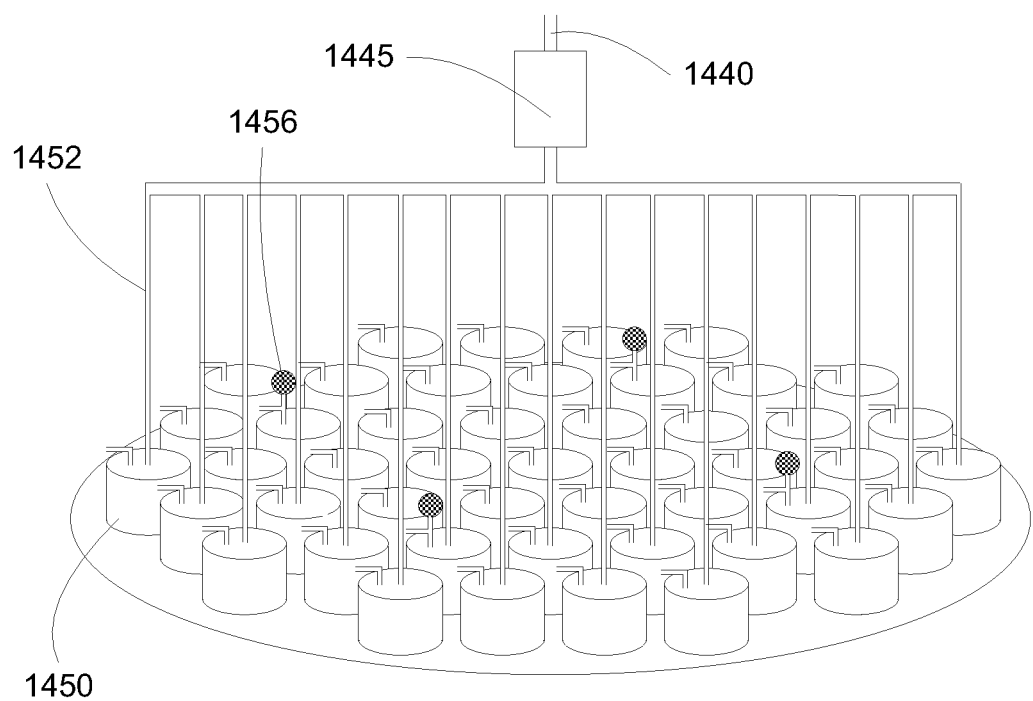
FIG. 14 illustrates an array of protective chucks disposed on a substrate according to some embodiments of the present invention.

FIG. 14 illustrates an array of protective chucks disposed on a substrate according to some embodiments of the present invention. Multiple protective chucks 1450 are touchlessly disposed on the substrate, protecting the multiple site isolated regions under the bottom surfaces of the chucks. A common gas inlet 1440, controlled by a flow controller 1445, provides gas flows to each of the protective chucks through gas inlet 1452. Each protective chuck also has a vent exhaust for exhausting the gas flow. Pressure gauges 1456 are coupled to selective chucks to measure pressure, and pressure fluctuation, of the gas layer. The selective chucks 1456 are preferably identified as the chucks that exhibit the highest or lower gas pressure, or the highest or lowest pressure fluctuations within the array of chucks. In some embodiments, the selective chucks are identified by the chuck array setting method described above.

In some embodiments, different behaviors of the protective chuck can be controlled by adjusting the gas flow or the exhaust conductance. The adjustment can be performed manually or automatically. For example, the gas flow or the gas conductance can be dynamically controlled according to a pressure measurement of the gas layer.

Figure 15A:
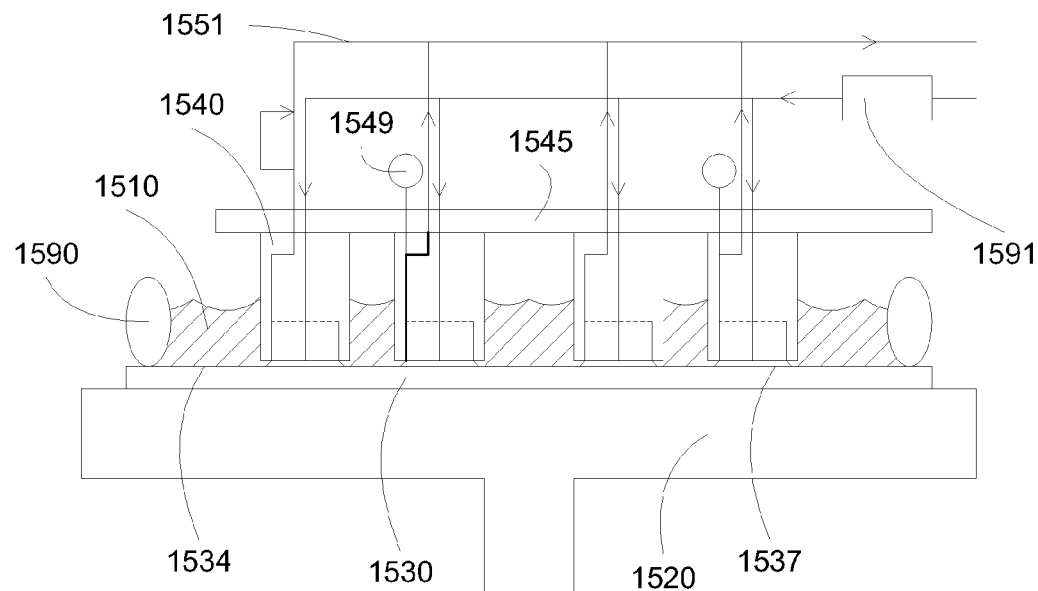
Figure 15A:
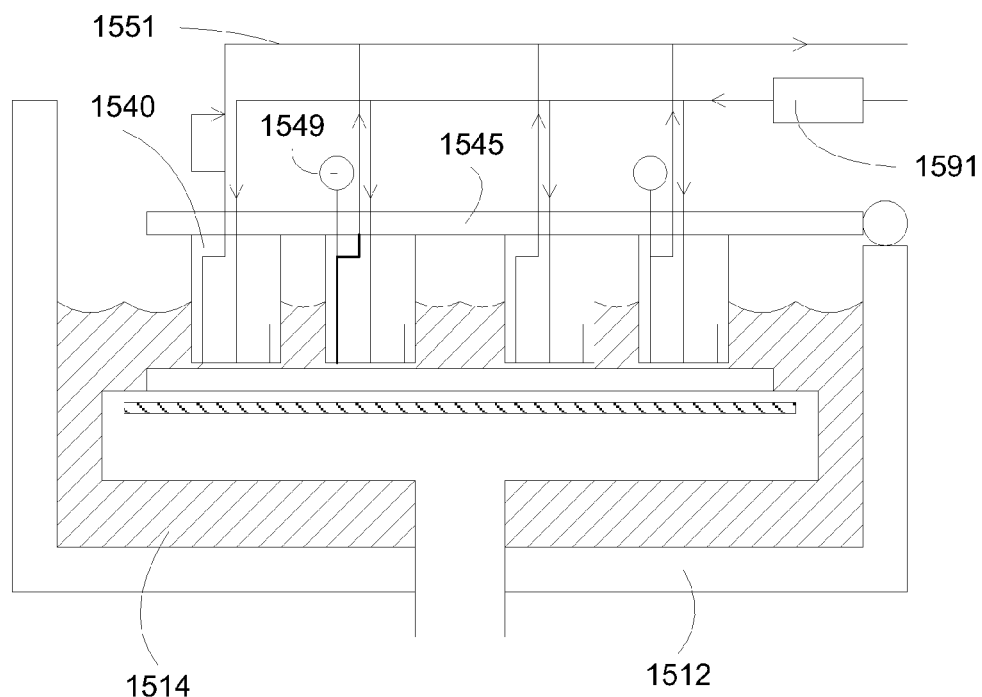

FIGS. 15A-15B illustrate exemplary high productivity combinatorial systems, which employ protective chucks according to some embodiments of the present invention. In FIG. 15A, a chamber, for example, a processing chamber within a high productivity combinatorial system, comprises a substrate support 1520. A substrate 1530 can be brought to the process chamber, and disposed on the substrate support 1520. A plurality of reactors 1540, for example, from a reactor array or assembly 1545, is lowered to the substrate surface, forming multiple site isolation regions 1537. Gas flowing to a common controller 1591 to the reactors 1540 and exhausting 1551 can pressurize the air gap, forming a gas layer under the reactors 1540. Processing fluid 1510, such as an etching solution or a cleaning solution, can be introduced to the substrate surface 1534, outside the site isolated regions 1537 defined by gas layer under the reactors 1540. The fluid is bounded by a fluid blocking element, such as an o-ring 1590, to contain the fluid within the substrate surface. The gas layer under the reactors 1540 is pressurized, preventing the fluid from entering the regions of the gas layer. The processing of the fluid is then restricted to the substrate surface outside the reactor areas, with the gas layer protecting the surface areas under the reactors.

One or more pressure gauges 1549 are installed at selective exhaust lines 1551 of reactors 1540. In some embodiments, the reactors are selected to exhibit the extreme pressure behaviors, such as highest or lowest values of pressure fluctuations. By adjusting the gas flow through the controller 1591 according to the measurements of the pressure gauges 1549, operation regimes can be selected. For example, static mode with lowest gas flow can be dynamically achieved by changing the gas flow to reach a low pressure fluctuation value FIG. 15B shows another processing chamber, comprising a tank 1512 having processing fluid 1514. The substrate, the substrate support, and a portion of the reactors are submerged in the tank 1512. The gas layer under the reactors is pressurized, preventing the fluid from entering the regions of the gas layer. The processing of the fluid is then restricted to the substrate surface outside the reactor areas, with the gas layers protecting the surface areas under the reactors. Similarly, operation regimes of the combinatorial system can be dynamically controlled by monitoring the pressure values of the pressure gauges 1549.

Figure 16:
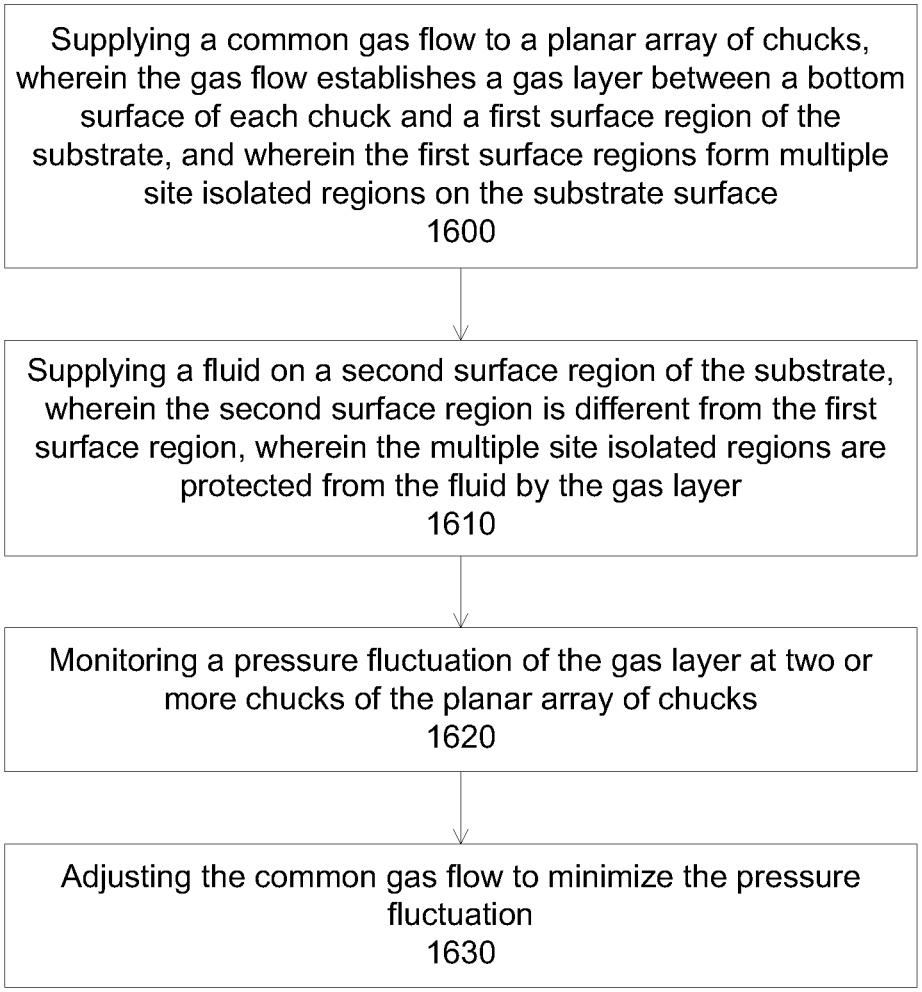
FIG. 16 illustrates an exemplary flowchart of dynamic control in a high productivity combinatorial system according to some embodiments of the present invention.

FIG. 16 illustrates an exemplary flowchart of dynamic control in a high productivity combinatorial system according to some embodiments of the present invention. A substrate is provided on a substrate support of a process chamber, for example, a processing chamber within a high productivity combinatorial system. The substrate might be needed to have certain surface areas processed, such as etching or cleaning. For example, the substrate can be deposited with a conductive layer in multiple site isolated regions, and requiring the removal of the deposited conductive layer at the substrate areas outside the site isolated regions to prevent electrical shortage between the site isolated regions. A reactor assembly can be lowered onto the substrate, wherein the reactor assembly comprises a plurality of reactors. The reactor assembly then forms multiple site isolation regions on the substrate surface. For example, the reactors can be positioned on existing site isolated regions on the substrate, covering these regions under the reactors. The reactors can form touchless site isolation regions, having a gap with the substrate surface to prevent particle generation due to contact friction.

Operation 1600 supplies a common gas flow to a planar array of chucks, wherein the gas flow establishes a gas layer between a bottom surface of each chuck and a first surface region of the substrate, and wherein the first surface regions form multiple site isolated regions on the substrate surface. The chuck is preferably disposed above the substrate without touching the substrate. In some embodiments, the gas layer further functions to levitate the chuck above the substrate surface. In some embodiments, magnetic levitation can be applied. A vent exhaust can be added to the bottom surface of the chuck, providing a return path for the gas flow.

Operation 1610 supplies a fluid on a second surface region of the substrate, wherein the second surface region is different from the first surface region, wherein the multiple site isolated regions are protected from the fluid by the gas layer. The fluid can be a processing fluid, such as a cleaning fluid or an etching fluid, to process the substrate surface region outside the region protected by the chuck. An o-ring can be disposed around the substrate to confine the processing fluid within the substrate surface. Since the gas layer under the reactors is pressurized, the fluid is prevented from entering the site isolated regions under the reactor bottom surface, and is disposed only on the remaining substrate surface, e.g., the area outside the site isolated regions defined by the reactors. The substrate surface not protected by the reactors is processed by the fluid. After processing, the processing liquid is removed, for example, by aspiration or by draining.

Operation 1620 monitors a pressure fluctuation of the gas layer at two or more chucks of the planar array of chucks. In some embodiments, a pressure gauge is disposed on the vent exhaust of the chuck, allowing the measurements of the pressure of the gas layer. Multiple measurements can be performed, allowing a determination of the changes in pressure. In some embodiments, the pressure changes can be measured as a function of time, with the fluctuation determined from the changes in pressure amplitudes at measurements at different times. In some embodiments, the pressure fluctuation can be determined from the frequency or period of the changes in pressure measurements. For example, a rapid change (or a short time) in pressure values can indicate a high pressure fluctuation.

Operation 1630 adjusts the gas flow to minimize the pressure fluctuation. The static mode of operation is characterized by a lower pressure fluctuation that the other operation modes of flow mode and bleed mode, and thus a static mode can be dynamically achieved by adjusting the gas flow until the pressure fluctuation is minimized. In some embodiments, a low gas flow is preferred to reduce expenses. The gas flow can be adjusted by increasing or decrease the gas flow until observing a substantial change in pressure fluctuation. Alternatively, the gas flow can be increased or decreased to minimize a fluid flow from the remaining surface to the surface region. In some embodiments, the two or more chucks exhibit highest and lowest pressure values at their gas layers.

In some embodiments, the gas flow is started at a middle range of the gas flow capability. Afterward, a pressure fluctuation is measured, and the gas flow is decreased or increased until a substantial change in pressure fluctuation is observed. Alternatively, a gas flow can start at a low value/high value with a measurement of pressure fluctuation. The gas flow can then increase/decrease, respectively, until a change in pressure fluctuation is observed.

In some embodiments, the pressure fluctuation is determined by amplitude variations. For example, the pressure fluctuation can be minimized by reducing the amplitude variations of the gas pressure to less than about 0.1 inch of water. In some embodiments, the pressure fluctuation is determined by frequency variations. For example, the pressure fluctuation can be minimized by reducing frequency variations of the gas pressure to less than about 10 Hertz.

Although the foregoing examples have been described in some detail for purposes of clarity of understanding, the invention is not limited to the details provided. There are many alternative ways of implementing the invention. The disclosed examples are illustrative and not restrictive.

What is claimed is:

1. A method for processing a substrate, comprising
positioning a chuck above the substrate, wherein a bottom surface of the chuck forms a gap with a first region of a surface of the substrate;
flowing a gas through a first conduit of the chuck, wherein the first conduit comprises a first outlet disposed on the bottom surface of the chuck, wherein the gas flows within the gap toward a periphery of the bottom surface, wherein at least a portion of the gas is removed through a second conduit of the chuck, wherein the second conduit comprises an inlet disposed on the bottom surface;
supplying a fluid on a second region of the surface of the substrate, wherein the flowing of the gas is operable to prevent the fluid from entering the gap;
monitoring a pressure fluctuation of the portion of the gas removed through the second conduit; and
adjusting the flowing of the gas in response to the monitoring.

2. The method as in claim 1 wherein the pressure fluctuation is monitored by measuring variations in an amplitude of variation of pressure.

3. The method as in claim 2 wherein the adjusting of the flowing of the gas in response to the monitoring comprises adjusting the flowing of the gas to reduce the variations in the amplitude of variation of pressure to less than about 0.1 inch of water.

4. The method as in claim 1 wherein the pressure fluctuation is monitored by measuring variations in a frequency of variation of pressure.

5. The method as in claim 4 wherein the adjusting of the flowing of the gas in response to the monitoring comprises adjusting the flowing of the gas to reduce the variations in the frequency of variation of pressure to less than about 10 Hertz.

6. The method as in claim 1 wherein the adjusting of the flowing of the gas comprises increasing the flowing of the gas until observing a change in the pressure fluctuation.

7. The method as in claim 1 wherein the adjusting of the flowing of the gas comprises increasing the flowing of the gas to reduce a fluid flow from the second region to the first region.

8. The method as in claim 1 wherein the adjusting of the flowing of the gas comprises decreasing the flowing of the gas until observing a change in the pressure fluctuation.

9. The method as in claim 1 wherein the adjusting of the flowing of the gas comprises decreasing the flowing of the gas to reduce a gas flow from the first region to the second region.

10. The method as in claim 1 wherein the flowing of the gas is initiated at a middle range of a gas flow capability.

11. A method comprising
providing a substrate, wherein a surface of the substrate comprises a plurality of site isolated regions;
positioning a plurality of chucks above the substrate, wherein a bottom surface of each of the chucks forms a gap with one of the site isolated regions of the surface of the substrate;
flowing a gas through a first conduit of each of the chucks, wherein the first conduit comprises a first outlet disposed on the bottom surface of each of the chucks, wherein the gas flows within the gap toward a periphery of the bottom surface,
wherein at least a portion of the gas is removed through a second conduit of each of the chucks, wherein the second conduit comprises an inlet disposed on the bottom surface;
measuring a pressure of the portion of the gas removed through the second conduit of each of the chucks;
identifying one or more first chucks having a high measured pressure;
identifying one or more second chucks having a low measured pressure; and
installing gauges operable to measure pressure at the one or more first chucks and the one or more second chucks.

12. A method for combinatorially processing a substrate, comprising
providing a substrate, wherein a surface of the substrate comprises a plurality of site isolated regions;
positioning a plurality of chucks above the substrate, wherein a bottom surface of each of the chucks forms a gap with one of the site isolated regions of the surface of the substrate;
flowing a gas through a first conduit of each of the chucks, wherein first conduit comprises a first outlet disposed on the bottom surface of each of the chucks, wherein the gas flows within the gap toward a periphery of the bottom surface, wherein at least a portion of the gas is removed through a second conduit of each of the chucks, wherein the second conduit comprises an inlet disposed on the bottom surface;
supplying a fluid on a second surface region of the substrate, wherein the second surface region is different from the plurality of site isolated regions, wherein the flowing of the gas is operable to prevent the fluid from entering the gap of each of the chucks;
monitoring a pressure fluctuation of the portion of the gas removed through the second conduits of two or more chucks; and
adjusting the flowing of the gas in response to the pressure fluctuation.

13. The method as in claim 12 wherein at least one of the two or more chucks exhibits a high pressure fluctuation.

14. The method as in claim 12 wherein at least one of the two or more chucks exhibits a low pressure fluctuation.

15. The method as in claim 12 wherein the pressure fluctuation is monitored by measuring variations in an amplitude of variation of pressure.

16. The method as in claim 15 wherein the adjusting of the flowing of the gas in response to the monitoring comprises adjusting the flowing of the gas to reduce the variations in the amplitude of variation of pressure to less than about 0.1 inch of water.

17. The method as in claim 12 wherein the pressure fluctuation is monitored by measuring variations in a frequency of variation of pressure.

18. The method as in claim 17 wherein the adjusting of the flowing of the gas in response to the monitoring comprises adjusting the flowing of the gas to reduce the variations in the frequency of variation of pressure to less than about 10 Hertz.

19. The method as in claim 12 wherein the adjusting of the flowing of the gas comprises increasing the flowing of the gas until observing a change in pressure fluctuation.

20. The method as in claim 12 wherein the adjusting of the flowing of the gas comprises decreasing the flowing of the gas until observing a change in pressure fluctuation.

* * * * *